US010097165B1

(12) United States Patent
Tsironis

(10) Patent No.: US 10,097,165 B1
(45) Date of Patent: Oct. 9, 2018

(54) HIGH GAMMA COMPACT HARMONIC TUNER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 15/581,154

(22) Filed: Apr. 28, 2017

Related U.S. Application Data

(60) Provisional application No. 62/328,729, filed on Apr. 28, 2016.

(51) Int. Cl.
*H03H 7/38* (2006.01)
*H03J 1/06* (2006.01)
*H03H 7/40* (2006.01)

(52) U.S. Cl.
CPC ...... *H03J 1/06* (2013.01); *H03H 7/40* (2013.01)

(58) Field of Classification Search
CPC .................................. H03H 7/38; H03H 7/40
USPC ..................... 333/32, 33, 17.3, 263
See application file for complete search history.

(56) References Cited

U.S. PATENT DOCUMENTS

| | | |
|---|---|---|
| 6,297,649 B1 | 10/2001 | Tsironis |
| 6,674,293 B1 | 1/2004 | Tsironis |
| 7,135,941 B1 | 11/2006 | Tsironis |
| 8,497,689 B1 | 7/2013 | Tsironis |
| 9,041,498 B1 | 5/2015 | Tsironis |

OTHER PUBLICATIONS

Load Pull System, [online], [Retrieved on Apr. 26, 2017]. Retrieved from Internet <URL: http://www.microwaves101.com/encyclopedia/loadpull.cfm>.
"Computer Controlled Microwave Tuner—CCMT", Product Note 41, Focus Microwaves Inc., Jan. 1998.
Directional Couplers, [online], [Retrieved on Apr. 26, 2017]. Retrieved from Internet <URL: http://www.e-meca.com/directional-couplers>.
"MPT, a universal Multi-Purpose Tuner", Product Note 79, Focus Microwaves Inc., Oct. 2004.
S-parameter Basics, [online], [Retrieved on Apr. 26, 2017]. Retrieved from Internet <URL: http://www.microwaves101.com/encyclopedia/sparameters.cfm>.
"Integrated (MPT) versus Cascaded-Tuner Harmonic Tuning", Focus Microwaves Inc., Product Catalogue 2013, pp. 100-101.
"High Resolution Tuners Eliminate Load Pull Performance Errors", Application Note 15, Focus Microwaves Inc., Jan. 1995.

*Primary Examiner* — Stephen E Jones

(57) ABSTRACT

Compact, high Gamma, wideband, multi-carriage-multi-harmonic tuners use a meandering slabline structure and multiple probes and carriages. The meandering structure reduces the overall tuner length by more than half at 0.4 GHz. The required slabline bends are made using a vertical-to-horizontal slabline transition. Multiple probes are employed within the slabline segment closest to the test port, in order to minimize the insertion loss at higher frequencies, caused by the slabline bends. This tuner structure is mostly effective starting at fundamental frequencies below 1 GHz and operating at fundamental or harmonic frequencies as high as 18 GHz.

6 Claims, 7 Drawing Sheets

HIGH GAMMA COMPACT HARMONIC TUNER

PRIORITY CLAIM

This application claims priority on provisional application 62/328,729, filed on Apr. 28, 2016, titled "HIGH GAMMA COMPACT HARMONIC TUNER".

CROSS-REFERENCE TO RELATED ARTICLES

1. Load Pull System, [online], [Retrieved on 2017 Apr. 26]. Retrieved from Internet <URL: http://www.microwaves101.com/encyclopedia/loadpull.cfm>
2. "Computer Controlled Microwave Tuner—CCMT", Product Note 41, Focus Microwaves, January 1998
3. Directional Couplers, [online], [Retrieved on 2017 Apr. 26]. Retrieved from Internet <URL: http://www.e-meca-.com/directional-couplers>
4. Tsironis, U.S. Pat. No. 7,135,941, "Triple probe automatic slide screw load pull tuner and method".
5. "MPT, a universal Multi-Purpose Tuner", Product Note 79, Focus Microwaves, October 2004.
6. S-parameter Basics, [online], [Retrieved on 2017 Apr. 26]. Retrieved from Internet <URL: http://www.microwaves101.com/encyclopedia/sparameters.cfm>
7. "Integrated (MPT) versus Cascaded-Tuner Harmonic Tuning", Focus Microwaves Inc., Product Catalogue 2013, Pages 100-101.
8. Tsironis, U.S. Pat. No. 6,297,649, "Harmonic rejection load tuner".
9. Tsironis, U.S. Pat. No. 6,674,293, "Adaptable pre-matched tuner system and method".
10. "High Resolution Tuners Eliminate Load Pull Performance Errors", Application Note 15, Focus Microwaves, January 1995.
11. Tsironis, U.S. Pat. No. 8,497,689, "Method for reducing power requirements in active load pull system", (FIG. 2).
12. Tsironis, U.S. Pat. No. 9,041,498, "Mechanically Short Multi-Carriage Tuner".

BACKGROUND OF THE INVENTION—PRIOR ART

This invention relates to high power (nonlinear) testing of RF or microwave transistors (DUT) in the frequency and time domain for Noise and Load Pull measurements (see ref. 1). Load pull is the method by which the load impedance presented to the DUT at a given frequency is changed systematically and the DUT performance, together with the associated impedance, is registered, with the objective to find an optimum depending on the overall design objectives, see ref. 1. This objective may be maximum power, gain, efficiency, linearity or else. The same is valid for the source side of the DUT. Passive (slide screw) tuners are used to create the various impedances presented to the DUT, see ref. 2. The electrical signals injected into the input of the DUT and extracted from the output can be measured using sampling devices, such as signal couplers (FIG. 1), see ref. 3. At high power the (nonlinear) DUT is saturating and deforming the sinusoidal input signal. As a result part of the output power is contained in harmonic frequency components. The DUT performance can only be fully optimized when all frequency components (fundamental and harmonic) are properly impedance-matched. This requires independent harmonic tuning, mainly at the DUT output and at the DUT input.

In the case of noise measurements the tuners are used to generate arbitrary source impedances and appropriate software is then used to extract the noise parameters. In all cases the size (length) of the tuners at low frequencies is a mechanically limiting factor, since proper coverage of the Smith chart reflection factor area requires the reflective probes (slugs) of the slide-screw tuner to travel along the airline at least one half of a wave-length ($\lambda/2$) at the lowest frequency of operation; the wave-length $\lambda$ is inverse proportional to the frequency F, following the rule $\lambda[cm]=30/F[GHz]$; i.e. at 1 GHz $\lambda=30$ cm, at 10 GHz $\lambda=3$ cm.

Harmonic impedance tuners have been introduced in 1999, see ref. 8, and 2004, see ref. 4 and 5. The early versions, see ref. 8, used resonant probes that allow tuning only at maximum Gamma ($\Gamma\approx1$) and need to be replaced for changing frequencies; in many cases this is sufficient, but in general it is a limitation. Later introduced harmonic tuners, see ref. 4 and 5, allow frequency agility and full Smith chart coverage, but at the cost of higher mechanical complexity and linear size (length), FIG. 2. Their accuracy is equal to or better than previous versions. They comprise a number of independent wideband reflective RF probes (31) insertable into and movable horizontally inside the slot of a slotted low loss transmission airline (slabline) (32). To tune independently three frequencies, harmonic or not, it has been shown experimentally, that there is need for at least three such probes (31), see ref. 5, whereas for two frequencies only two probes are required, see ref. 9. It needs to be noted that there is no theoretical explanation why two probes handle two frequencies and three probes handle three frequencies. It is simply an experimental finding of which there is no proof of the contrary. Each probe is attached to the vertical axis of a carriage (33) and positioned by a precision remotely controlled gear mechanism, FIG. 2. The main shortcoming of such tuners is their linear length, due to the required length of the slabline, because it has been found experimentally that, in order to generate arbitrary reflection factors (impedances) at any harmonic or not frequency, each probe and associated carriage must move horizontally approximately at least one half of a wavelength ($\lambda/2$) at the lowest (fundamental) frequency Fo, FIG. 2. Mechanically speaking, the lowest fundamental frequency determines the length of the tuner as discussed previously.

In a real tuner apparatus (FIG. 2) the size of additional supporting items, such as the length (width) of the mobile carriages themselves (LC) and the length (thickness) of the side-walls (LW) of the tuner housing, add to the overall tuner length. In practical terms the minimum overall length of the slabline of a three carriage harmonic tuner, without the size of the input and output connectors, at the fundamental frequency Fo is: $L=3*\lambda/2(Fo)+3*LC+2*LW$ (see FIG. 2). For example, considering a typical width (LC) of a carriage being $LC\approx3$ cm and the thickness of each side-wall being $LW\approx1$ cm, then a, prior art linear three-carriage tuner, (FIG. 2), starting at a lowest frequency of 400 MHz (0.4 GHz) has a minimum length of $L\approx3*15$ cm/0.4+3*3 cm+2*1 cm=3*37.5 cm+9 cm+2 cm=123.5 cm.

BRIEF SUMMARY OF THE INVENTION

This invention discloses (a) wideband, (b) compact, (c) high Gamma, (d) harmonic (multi-carriage multi-probe) RF tuners using serpentine (meandering) slabline and multiple low and high frequency probes controlled by several single carriages and one double carriage. The meandering structure reduces the overall tuner linear length to less than half its size at 0.4 GHz. The required slabline bends are made using vertical-to-horizontal slabline transitions. The wide bandwidth is covered using two sets of three tuning probes each: low frequency and high frequency probes. One low frequency and all high frequency probes are inserted in the slabline segment closest to the test port, in order to minimize the insertion loss at higher frequencies, caused by the slabline bends. The size reduction of this tuner structure is mostly effective starting at fundamental frequencies below 1 GHz and allows operating at fundamental or harmonic frequencies as high as 18 GHz. The structure allows maximizing the tuning range (maximum reflection factor or "Gamma") at high frequencies.

Using the meandering technique, see ref. 12, such a tuner can be reduced to an overall length of approximately 50 cm (linear length reduction factor 123.5/50≈2.5). If the lowest frequency is 2 GHz (λ=15 cm) the total actual tuner length is 33.5 cm; using the ref. 12 technique this would become around 20 cm, a reduction ratio of ≈1.67. The shortcoming of the ref. 12 structure, however, is that it requires high frequency probes to be inserted beyond the slabline segment closest to the test port. The insertion loss introduced by the first and second slabline bends U1 and U2 affects the tuning range differently at low (F<<F2) (56) and high (F>>F2) (55) frequencies. It reduces the tuning range of those probes especially at high frequencies (55) (FIG. 5); it is therefore beneficial if those probes are inserted closer to the test port. This is possible using the herein disclosed tuner structure. Hereby F2 is the maximum (cutoff) frequency of the low frequency probes (FIG. 4).

BRIEF DESCRIPTION OF THE DRAWINGS

The invention and its mode of operation will be better understood from the following detailed description when read when read with the appended drawings in which.

DETAILED DESCRIPTION OF THE INVENTION

Figure 6:
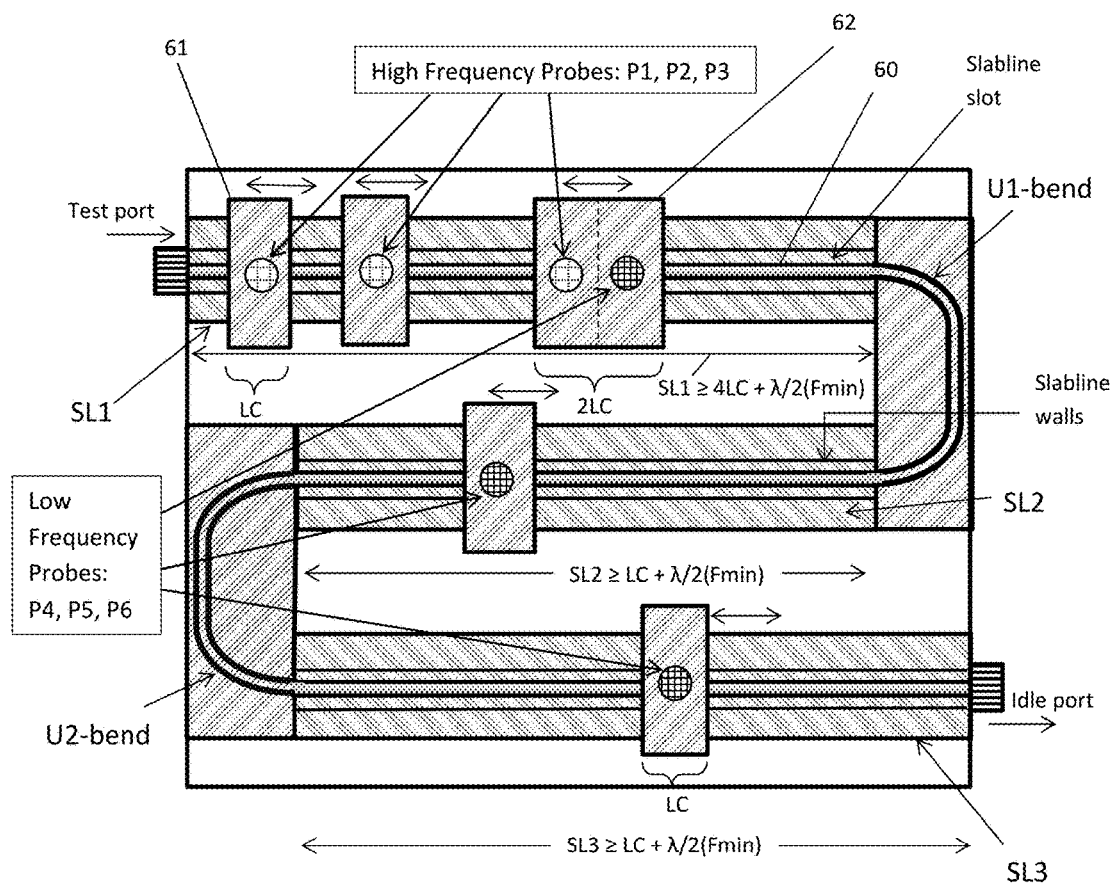
FIG. 6 depicts top view of high Gamma, compact multi-carriage, wideband, harmonic tuner structure.

The mechanically short, high Gamma, multi-carriage impedance tuner is based on a "meandering" or "serpentine" low loss slotted airline (slabline), employing a multitude of carriages (61), (62) and tuning probes (P1 to P6) which are arranged appropriately inside the three segments (SL1 to SL3) of the meandering slabline (FIG. 6). The slabline comprises three straight sections (SL1 to SL3), in which mobile carriages (61), (62) etc. are mounted. The carriages hold and control metallic RF probes (slugs) (31) in FIG. 3, and P1 to P5 seen from the top in FIG. 6, which are attached to vertical axes, positioned, remotely controlled and moved vertically towards the center conductor or horizontally along the axis of the slabline (see ref. 12). Each section SL1 to SL3 behaves as a single probe wideband impedance tuner (see ref. 2) whereby each low frequency probe covers frequencies from the minimum frequency Fmin up to a frequency F2 and each high frequency probe covers frequencies from a minimum frequency F1 up to a maximum frequency Fmax (FIG. 4). The cascade of the three slabline/tuner segments SL1 to SL3 behaves as a multi-carriage multi-probe harmonic tuner (see ref. 5).

Each mobile carriage (61), (62) etc. rides on a slider to guide it parallel to the Slabline slot and center conductor (60) of the slabline and a gear (not shown) in form of a lead screw, timing belt or rack-and-pinion to move it in the same direction. A schematic presentation of top view of such a new tuner apparatus is in FIG. 6 and, in the non-high Gamma version, in the prior art tuner in FIG. 3. The gear is connected mechanically through a belt or rack and pinion mechanism to a stepper motor, which is electrically and remotely controlled by an electronic control board linked to an external PC controller and associated control software. The carriages also comprise precision vertical axes, also controlled by stepper motors, which position the RF probes (slugs) (31) or P1 to P6 in controlled distance and capacitive coupling with the center conductor (60) of the slabline in order to create controlled reflection (FIG. 4).

Figure 2:
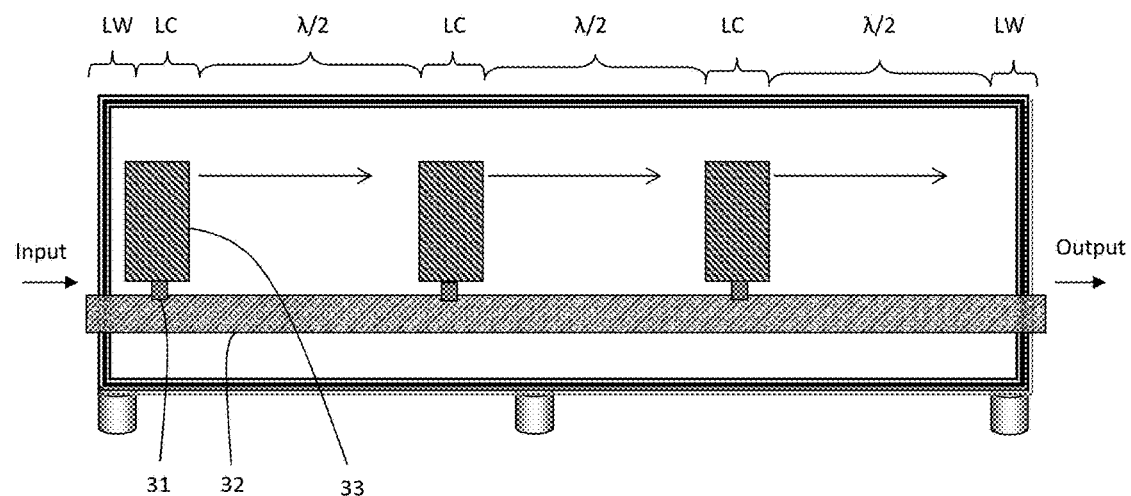
FIG. 2 depicts prior art, three-carriage (linear) harmonic tuner; example: Fmin=0.7 GHz, total length≈38" (96.5 cm).

In the serpentine multi-section tuner (FIGS. 3 and 6) the mobile carriage mechanism is essentially the same as prior art (see FIG. 2); but the carriages are not placed "in line". Instead they travel "in parallel" in the parallel straight sections SL1 to SL3 of the slabline. In the case of this invention (FIG. 6) the slabline section connected to the test port (SL1) supports three mobile carriages, whereas the slabline sections SL2 and SL3 support one each. One carriage in section SL1 is double and the other two single. The carriages in sections SL2 and SL3 are all single. If the tuner in FIG. 2 or 3 were to cover the same frequency bandwidth as the tuner in FIG. 6, all three carriages (33) and (54) would have to be double —carrying two probes each— which would make both said prior art tuners even longer. A single carriage (61) has one vertical axis, whereas a double carriage (62) has two independent vertical axes. Each axis carries and controls the vertical position of one reflective tuning probe. When the probe is approaching the center conductor the capacitance creates a reflection factor, of which the magnitude is inversely proportional to the gap between probe and center conductor. Typically such gaps vary between a minimum of 50-100 μm and a maximum of 2-3 mm. Beyond a gap of 3 mm the capacitive coupling is too weak to modify the electric field significantly and below a gap of 50 μm the control and mechanical precision are insufficient to guarantee short-circuit free operation over the whole carriage travel along the slabline.

Figure 3:
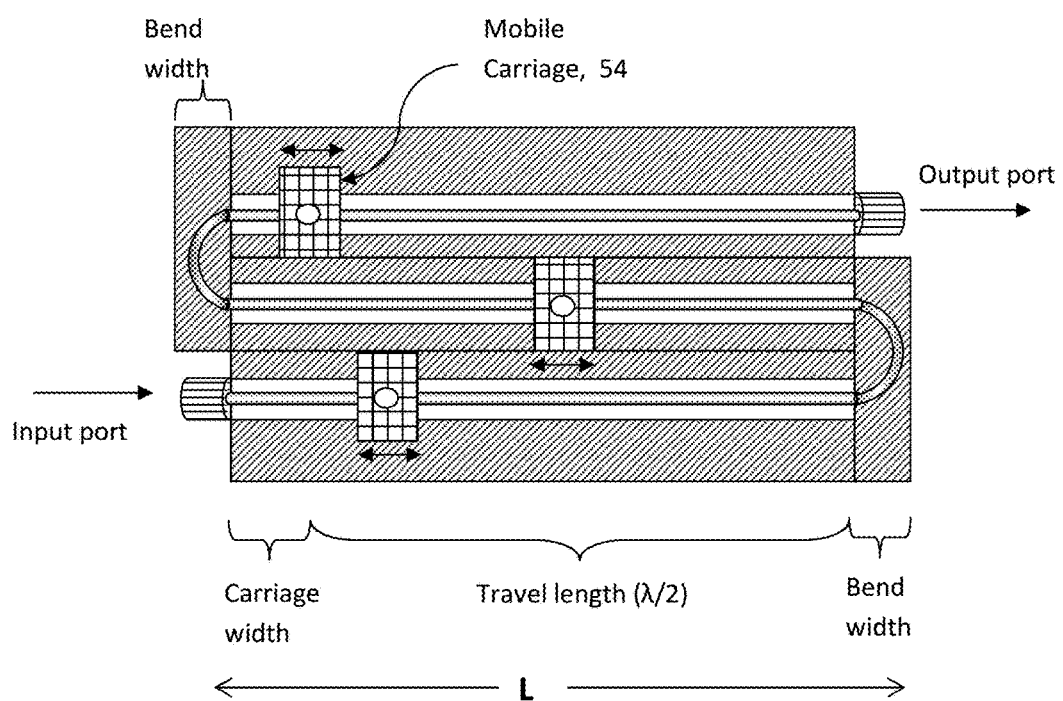
FIG. 3 depicts prior art, three-carriage (meandering) harmonic tuner using a single probe per slabline segment; example Fmin=0.7 GHz, total length≈13.8" (34.5 cm).
Figure 4:
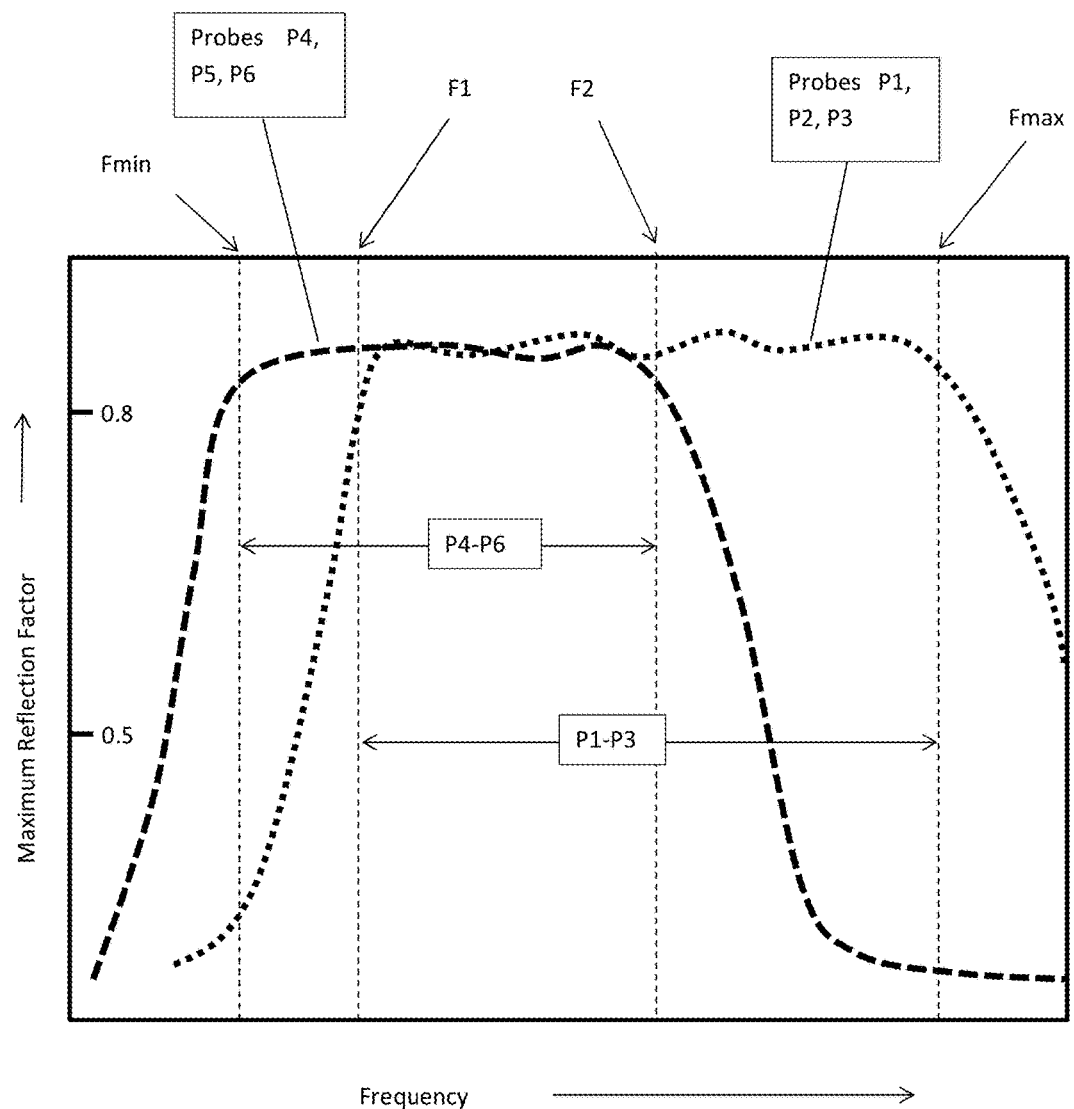
FIG. 4 depicts frequency response (maximum reflection factor) of low and high frequency probes used in compact, high Gamma multi-carriage tuner.
Figure 5:
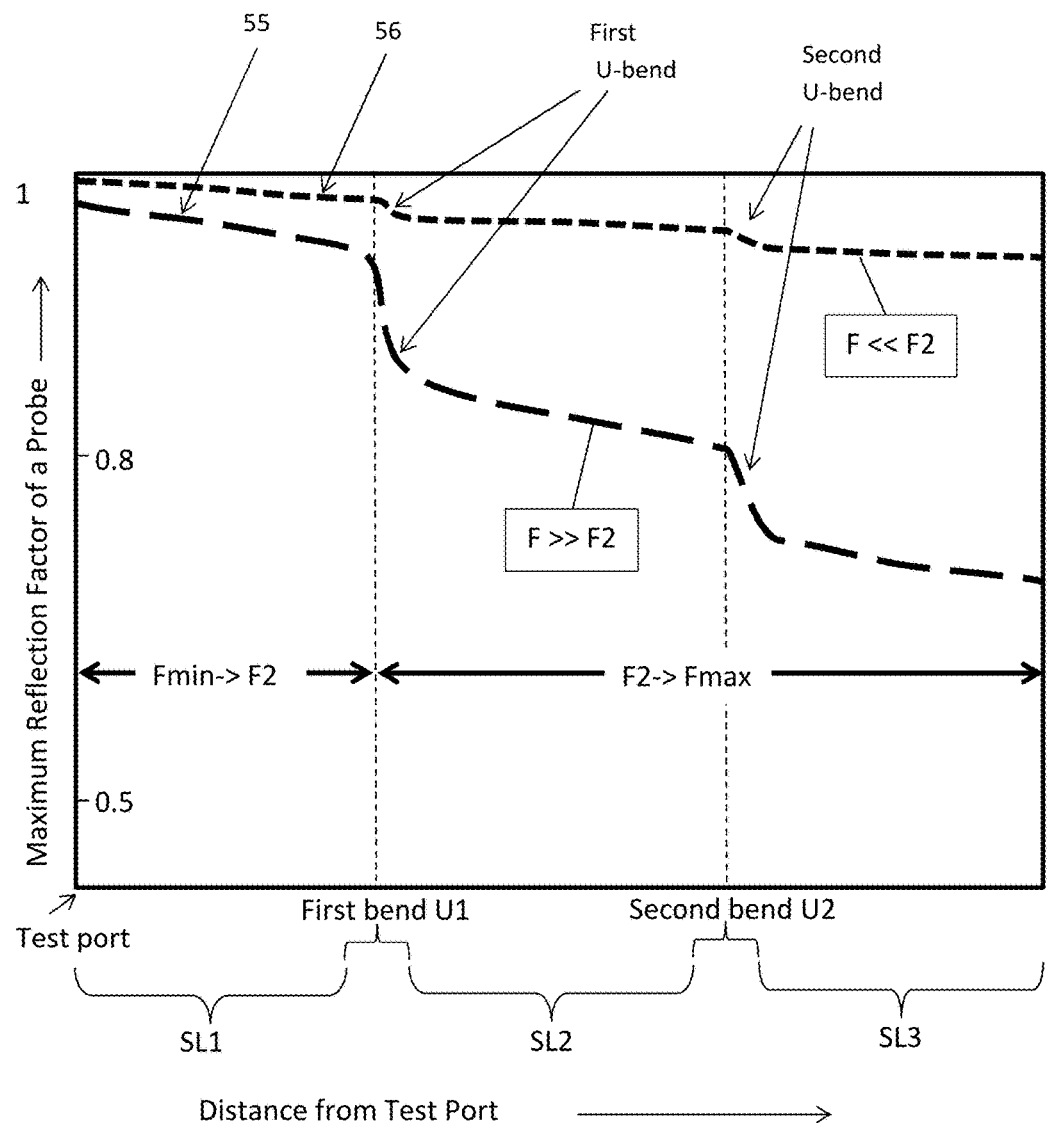
FIG. 5 depicts maximum reflection factor of meandering tuner probes as a function of physical distance from the test port for low (F<<F2) and high (F>>F2) frequencies.

The disadvantage of meandering prior art tuners, shown in top view in FIG. 3, is understood by viewing FIG. 5. FIG. 5 shows the total insertion loss between the test port and a point along the meandering slabline. This insertion loss reduces the tuning range (maximum obtainable reflection factor) of each probe as it travels along the slabline. The insertion loss is shown for two frequencies: a low frequency F<<F2 (55) and a high frequency F>>F2 (56), whereby F2 is a typical frequency approximately in the geometrical center of the frequency band. The geometrical center between three numbers A, B and C is defined as B/A≈C/B. For instance in the case of a 0.4 to 10 GHz tuner, F2 is approximately 2 GHz. More detailed analysis is disclosed below. The choice of F2 is important because it allows optimizing the probe configuration for continuous harmonic tuning operation at maximum possible reflection factor (Gamma). FIG. 5 shows that, at low frequencies the effect on insertion loss of the slabline "U" bends relative to associated straight line sections is small, whereas at high frequencies it is considerable. This insertion loss reduces Gamma and therefore the tuning range of the tuner (see ref. 11, FIG. 2). "U" bends create higher insertion loss because they are line transitions, and transitions disturb the electro-magnetic field, leading inexorably to higher residual reflections and insertion loss than homogenous transmission lines. This is shown illustrative in FIG. 5 in the areas marked "First U-bend" and "Second U-bend", whereby the first U-bend is closest to the test port. In short, placing high frequency probes far from each-other and separating them with U-bends is disadvantageous.

From FIG. 5 it is obvious that placing high frequency probes beyond the first U-bend is ineffective, because the insertion loss of the first and even more of the second U-bend and the intervening line sections will reduce the tuning range of the high frequency probe (see ref. 7). Also, at high frequencies the horizontal travel provided by slabline sections 2 and 3 is not required, since the wavelength is much shorter. In this embodiment therefore the high frequency probes P1 to P3 are all mounted inside the first section SL1, between the test port and the first U-bend (FIG. 6). Obviously, though, for the low frequencies the first low frequency probe (P4) must also be inserted in the first section SL1, whereas the other two low frequency probes (P5 and P6) are inserted inside the second (SL2) and third (SL3) sections. To do so one of the carriages in section SL1 must be double; in FIG. 6 it is shown this to be carriage C1 (62). Any carriage in section SL1 can be double, i.e. carry a low and a high frequency probe. In fact if, as in this case, the double carriage is the third one in SL1, then the tuning range at high frequencies will benefit, since the high frequency probes are even closer to the test port. However in practical terms this is not of highest importance. What is more important is not to include a lossy U-bend between high frequency probes, which is the distinct advantage of this embodiment.

There are two critical limitations that need to be satisfied for proper harmonic tuning operation. The first one is that all three probes of the same frequency range (P1 to P3) and (P4 to P6) must be able to travel horizontally at least one half of a wavelength at the lowest frequency in their band. For instance in a 0.8 to 18 GHz tuner, probes P4 to P6 must be able to travel at least one half of a wavelength at 0.8 GHz (18.75 cm or 7.38"). The second limitation is that, for proper three independent harmonic tuning operation, all probes in each frequency range must cover the three harmonic frequencies Fo to 3Fo, whereby Fo is the fundamental frequency. For instance, if Fo=0.8 GHz, the probes P4 to P6 must cover at least 0.8 to 2.4 GHz; and if the cutoff frequency of probes P4 to P6 is F2 (FIG. 4), then the maximum fundamental frequency in the low band is F2/3. Correspondingly the high frequency probes P1 to P3 must cover the frequency range from F1 to Fmax (FIG. 4). In this case the lowest fundamental frequency is F1 and the highest Fmax/3. Obviously 3*F1<Fmax, otherwise third harmonic operation would not be possible. The same is valid in the low frequency range: 3*Fmin <F2.

The above considerations govern the design and dimensioning the slabline segments SL1 to SL3 and the probe coverage of P1 to P3 and P4 to P6, depending on Fmin and Fmax. A further limitation is, of course, the cutoff frequency of the slabline itself: A rule of thumb, valid up to approximately 18 GHz is that the first spurious transmission mode occurs at a cutoff frequency Fco for which the closest distance between the center conductor and the slabline sidewall is one eighth of the wavelength ($\lambda$(Fco)/8). In practical terms, if the center conductor has a diameter of D [mm] and the slabline channel has a width of W [mm], then $\lambda$(Fco)/8=(W−D)/2; or Fco [GHz]≈75/(W−D)[mm]. Beyond this limitation though the practical limitations of the probe tuning coverage govern the design. The frequencies F1 and F2 (FIG. 4) must be carefully chosen in order to allow continuous harmonic frequency operation. It follows that F2=3*F1 is the necessary condition for this. The tuner can operate between Fmin and F1 as low frequency fundamental using probes P4 to P6 covering Fmin to F2 (=3*F1); and between F1 and Fmax/3 fundamental high frequency, the probes P1 to P3 covering F1 to Fmax.

Concerning the length of the longest slabline section (SL1) this must include the three carriages C1 to C3, having a total width of 4*LC (two LC for the double carriage and two LC for the two single ones) and allow the double carriage to travel at least $\lambda$/2(Fmin) and each single carriage $\lambda$/2(F1). The total length of SL1 is therefore: SL1=4*LC+$\lambda$/2(Fmin), required for lowest frequency operation or SL1=4*LC+3/2*$\lambda$(F1) required for the lowest frequency of the high frequency band, whichever is larger. If F1=3Fmin then in both cases SL1 is the same. As an example: LC=1", Fmin=0.8 GHz, F1=1.5 GHz, F2=4.5 GHz, Fmax=18 GHz yields: SL1=11.38" or SL1=11.87", depending if we tune high or low band frequencies. The right choice would then be 11.87". This is still an important reduction in size compared with prior art linear three carriage wideband tuner, having three double carriages in a single straight slabline SL, with a length of: SL=3*2*LC+3/2*$\lambda$(0.8 GHz)=28.14". This is a size reduction by a factor of 2.37; if Fmin=0.4 GHz this reduction factor becomes even larger: 2.69 (50.29" versus 18.7").

Figure 1:
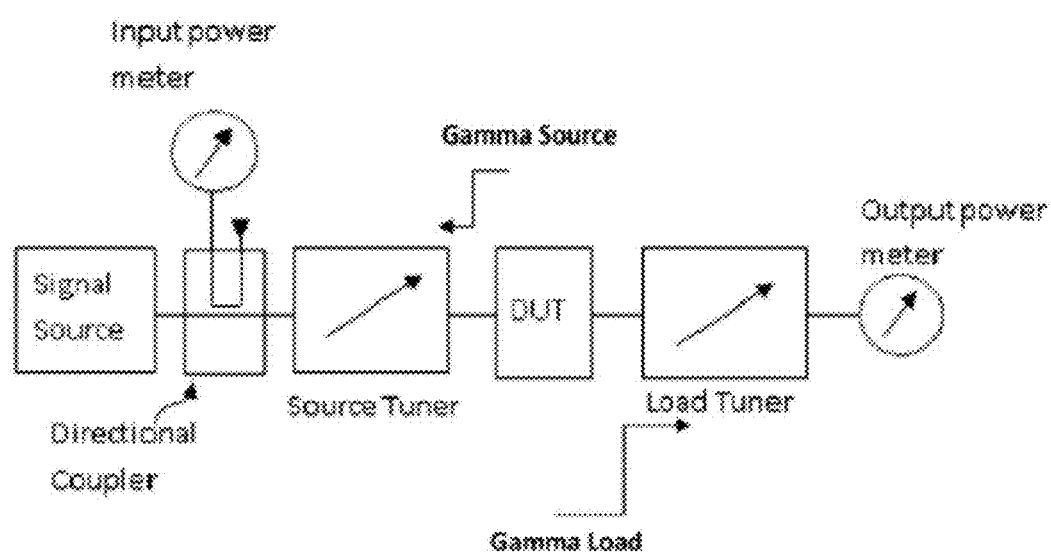
FIG. 1 depicts prior art, Load Pull measurement setup.
Figure 7:
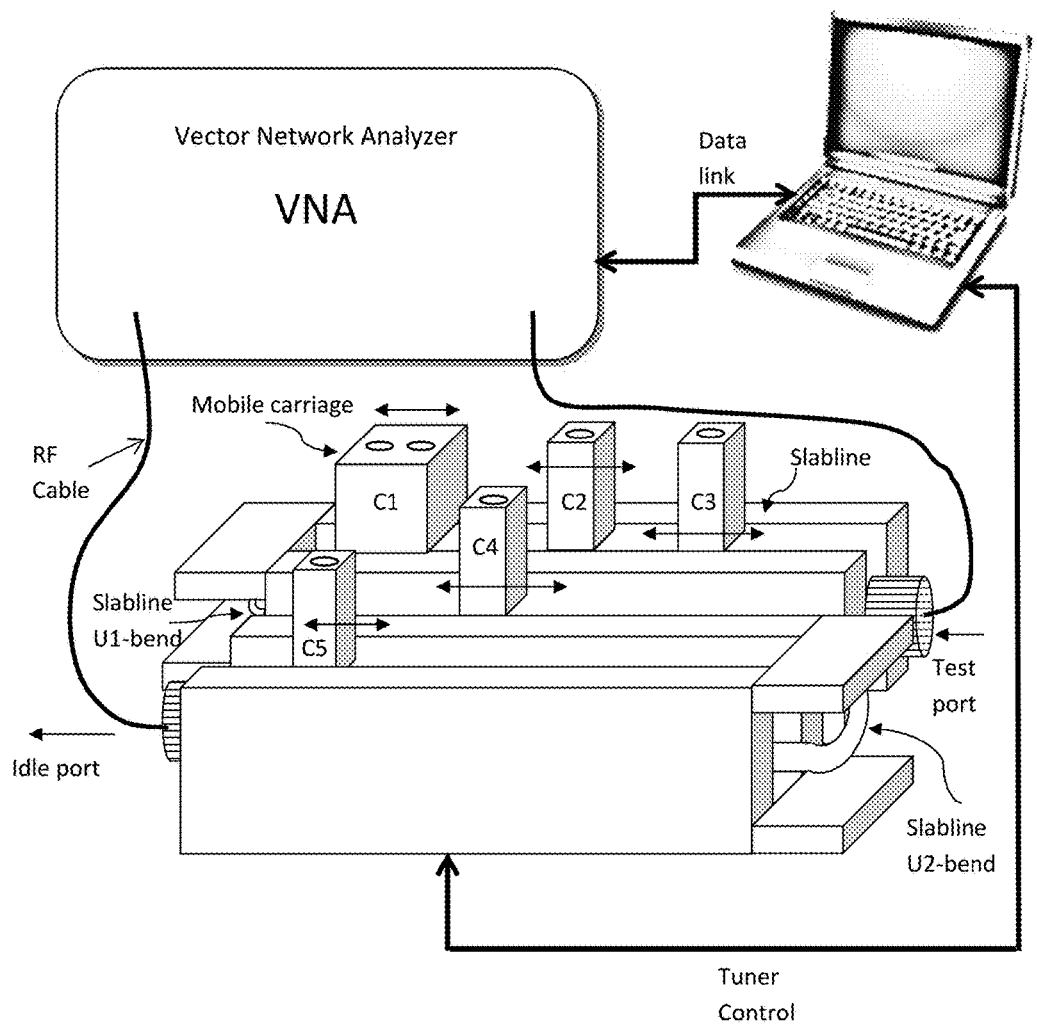
FIG. 7 depicts tuner calibration setup.

The multi-carriage tuner is calibrated by connecting it to a pre-calibrated vector network analyzer using flexible RF cables (FIG. 7) and controlling both, the network analyzer and the tuner using a system or control computer. The tuner probes are positioned at a number of pre-determined states and two-port scattering parameters (S-parameters) (see ref. 6) are measured by the network analyzer. Depending on the frequency selected probes P1 to P3 or P4 to P6 are calibrated separately. The S-parameters generated by all probes, except one, are de-embedded by the S-parameters of the "initialized tuner box" (=initialized tuner=all probes withdrawn from the slabline) and saved in temporary or permanent computer memory before cascading all position permutations in computer memory in order to create the complete tuner calibration data (see ref. 5). The calibration data is then used to create user defined impedances ("tuning") when the tuner is used in a test setup (see ref. 1), FIG. 1, by efficient search algorithms targeting a minimum vector difference between the target reflection factors and the calibrated data points and associated interpolated points between the calibrated ones (see ref. 10, pages 6 and 7) at the fundamental and harmonic frequencies.

This invention discloses (i) multi-carriage (harmonic), (ii) high Gamma, (iii) mechanically short and (iv) wideband tuners, which use meandering or serpentine slablines and multiple tuning probes and mobile carriages. The critical issue of slabline bends is addressed using vertical-horizontal slabline transitions. Multiple probes are inserted into the first segment of the slabline, closest to the test port, in order to increase Gamma at higher frequencies by minimizing the insertion loss caused by the slabline and the bends. Obvious alternatives to the disclosed embodiment shall not impede on the validity of the invention.

What I claim as my invention is:

1. A multi-carriage slide screw impedance tuner comprising two ports, a test port and an idle port, and a slotted, meandering, low loss airline (slabline) between the ports, whereby the slabline comprises three parallel straight sections, SL1 to SL3 and two "U" bends, U1 and U2, the total forming an "S";

and whereby U1 connects SL1 with SL2 and U2 connects SL2 with SL3;

and whereby SL1 is attached to the test port and SL3 to the idle port;

and five mobile carriages C1 to C5, sliding independently along the axis of the straight slabline sections SL1 to SL3, said carriages having vertically movable axes, each axis holding one reflective tuning probe (slug) P1 to P6, said probes being vertically insertable into the slabline slot and capacitively coupled with the center conductor of the slabline, whereby carriages C1 to C3 are mount on section SL1, carriage C4 is mount on SL2 and carriage C5 on SL3;

and whereby carriage C1 is a double carriage comprising two independent vertical axes and carriages C2 to C5 are single carriages comprising one vertical axis each;

and whereby carriage C1 controls a low frequency probe P4 and a high frequency probe P1, carriages C4 and C5 control low frequency probes P5 and P6 and carriages C2 and C3 control high frequency probes P2 and P3 respectively.

2. A tuner as in claim 1, whereby probes P1 to P3 are high frequency probes capable of creating high reflection between a frequency F1 and the maximum frequency Fmax, and whereby probes P4 to P6 are low frequency probes capable of creating high reflection between a minimum frequency Fmin and a frequency F2;

whereby Fmin is smaller than F1 (Fmin <F1), F2 is larger than F1 (F2>F1) and Fmax is larger than F2 (Fmax >F2).

3. A tuner as in claim 2, whereby the first slabline section SL1 has a length of at least three times the width (LC) of the single mobile carriage, plus one time the width of the double carriage plus one half of the wavelength at the lowest frequency, $\lambda/2$(Fmin), and whereby the second and third sections SL2 and SL3 have a length of at least one half of the wavelength at the lowest frequency, $\lambda/2$(Fmin), plus the width (LC) of the single mobile carriage.

4. A tuner as in claim 3 whereby all carriages and vertical axes are remotely controlled using electric stepper motors, appropriate gear, electronic control boards and control software operated by an external PC controller.

5. A tuner as in claim 1, whereby the slabline sections SL1 to SL3 comprise two vertical metallic walls and a center conductor;

and whereby the bends U1 and U2 comprise a center conductor and two lateral metallic walls, forming horizontal slabline sections, dimensioned in order to create the same characteristic impedance as the adjacent vertical straight slabline sections SL1 to SL3, and whereby the center conductor of bend U1 joins the center conductors of SL1 and SL2 and the center conductor of U2 joins the center conductors of SL2 and SL3.

6. A tuner as in claim 5 whereby the characteristic impedances of the slablines SL1 to SL3 and bends U1 and U2 are 50 Ohms.

* * * * *